United States Patent
Wu et al.

(10) Patent No.: US 6,225,204 B1
(45) Date of Patent: May 1, 2001

(54) METHOD FOR PREVENTING POISONED VIAS AND TRENCHES

(75) Inventors: Kun-Lin Wu, Taichung; Horng-Bor Lu, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/168,226

(22) Filed: Oct. 7, 1998

(30) Foreign Application Priority Data

Jul. 28, 1998 (TW) .................................................. 87112288

(51) Int. Cl.⁷ ....................................................... H01L 21/44
(52) U.S. Cl. ......................... 438/597; 438/594; 438/723; 438/734; 438/740; 438/743
(58) Field of Search ..................................... 438/594, 734, 438/740, 743, 723

(56) References Cited

U.S. PATENT DOCUMENTS 6,013,581 * 1/2000 Wu et al. ............................ 438/734

* cited by examiner

*Primary Examiner*—Richard Elms
*Assistant Examiner*—Pho Luu
(74) *Attorney, Agent, or Firm*—Oppenheimer, Wolff & Donnelly, LLP

(57) ABSTRACT

A method for preventing the occurrence of poisoned trenches and vias in a dual damascene process that includes performing a densification process, such as an implantation process, on the surface of the exposed dielectric layer around the openings before the openings are filled with conductive material. The densified surface of the dielectric layer is able to efficiently prevent the occurrence of poisoned trenches and vias caused by the outgassing phenomena.

25 Claims, 4 Drawing Sheets

METHOD FOR PREVENTING POISONED VIAS AND TRENCHES

CROSS-REFERENCE TO RELATED APPLICATION

This application claims the priority benefit of Taiwan application serial no. 87112288, filed Jul. 28, 1998, the full disclosure of which is incorporated herein by reference.

BACKGROUND OF THE INVENTION

1. Field of the Invention

This invention relates to a method for fabricating multi-level interconnects, and more particularly, to a method for preventing the occurrence of poisoned vias and trenches.

2. Description of Related Art

A dual damascene process is a technique which imbeds interconnects into an insulator. This process includes forming an insulator, planarizing and patterning the insulator to form trenches and via holes, and filling the trenches and via holes with metal to form conducting wires and via plugs. A chemical mechanical polishing process is then performed to planarize the surface of a device. Because a dual damascene process prevents the occurrence of overlay error and process bias of a conventional metallization process, it has been widely applied in semiconductor processes to improve the reliability of devices.

FIGS. 1A through 1D are schematic, cross-sectional views illustrating the steps taken in a conventional method for fabricating a dual damascene structure.

Referring to FIG. 1A, a substrate 100 contains a metal layer 102. A silicon nitride layer 104, which is used as an etching stop, and a silicon oxide layer 106, which is used as a dielectric layer, are formed on a provided substrate 100 in sequence by performing chemical vapor deposition processes. A chemical mechanical polishing process is performed to polish the dielectric layer 106 to a desired thickness, the depth of desired via plugs. Then, a silicon-oxy-nitride or silicon nitride layer 108 used as another etching stop and a silicon oxide layer 110 used as another dielectric layer are formed on the dielectric layer 106 in sequence by chemical vapor deposition processes. A chemical mechanical polishing process is performed to ensure that the thickness of the dielectric layer 110 equals the thickness of the conducting wires of the dual damascene structure to be formed in a follow-up process.

Referring next to FIG. 1B, the dielectric layer 110 is patterned to form openings 112, wherein the positions of the openings 112 correspond to the positions of the metal layer 102 underneath.

Referring to FIG. 1C, a portion of the etching stop 108 that is exposed within the openings 112 is removed for transferring pattern onto the etching stop 108. By using another patterned photoresist layer (not shown in figure) and the patterned etching stop 108 as masks, the dielectric layer 106 and 110 are etched to form via holes 116 and trenches 114. By using etching stop 108 as a mask, the etching stop 104 is patterned to expose the metal layer 102. The trenches 114 and via holes 116 compose the openings 118 of a dual damascene structure.

Referring next to FIG. 1D, the openings 118 are filled with a conformal barrier/glue layer 122, composed of titanium/titanium nitride, and a metal layer 124, composed of aluminum, to form a dual damascene structure 126. A chemical mechanical polishing process is performed to remove unwanted barrier/glue layer 122 and metal layer 124 from the top of the dielectric layer 110.

As the integration of a semiconductor device is increased, the resistance-capacitance delay regarding the parasitic capacitance generated by an inter-metal dielectric layer, such as dielectric layers 110 and 106 as shown in FIG. 1D, is worsened. Hence, it is common to utilize low-permittivity dielectric to form inter-metal dielectric in a sub-micron semiconductor fabrication process. Conventionally, the low-permittivity dielectric includes organic materials such as spin-on-polymer (SOP), flare, SILK, parylene, and inorganic materials, such as HSQ and FSG. Since most low-permittivity dielectrics tend to absorb moisture, they cause outgassing phenomena during the process of filling conductive material into the openings 118. The outgassing phenomena within the dielectric layers further lead to the occurrence of poisoned trenches and vias that degrade the yield and the electrical property of a device.

SUMMARY OF THE INVENTION

It is therefore an objective of the present invention to provide a method for preventing the occurrence of poisoned trenches and vias in a dual damascene structure.

In accordance with the foregoing and other objectives of the present invention, the invention provides a method that mainly includes performing an implantation process on the dielectric layer neighboring and within the dual damascene opening before the opening is filled. The material, which includes phosphorus or arsenic, is implanted into the dielectric layer by a implanter with a angle θ to the normal line perpendicular to the top surface of the substrate. The entire wafer rotates horizontally during the implantation process to ensure that material is evenly implanted into the dielectric layer. The implantation process densifies the surface of the dielectric layer, so that the densified surface of the dielectric layer is able to efficiently prevent the occurrence of poisoned trenches and vias caused by the outgassing phenomena.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method of a dual damascene structure for efficiently preventing the occurrence of poisoned trenches and vias, as shown in FIGS. 2A through 2E.

Figure 1A:
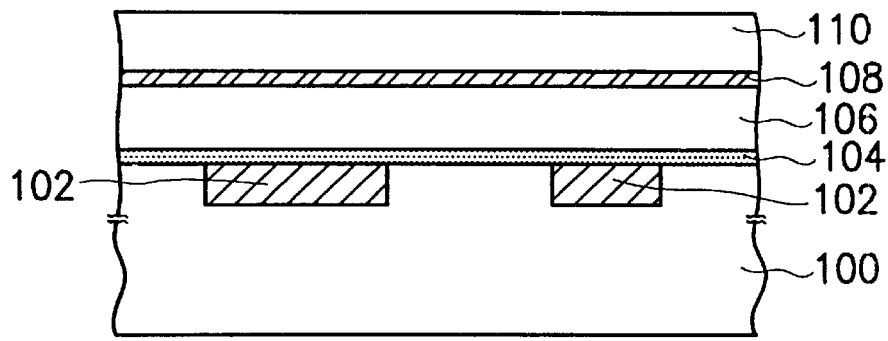
FIGS. 1A through 1D are schematic, cross-sectional views showing processing steps taken in a conventional fabricating method of a dual damascene structure.
Figure 1B:
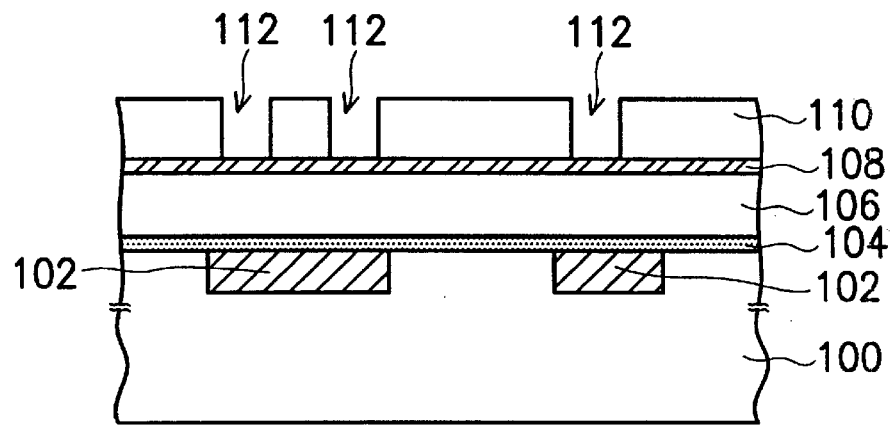
Figure 1C:
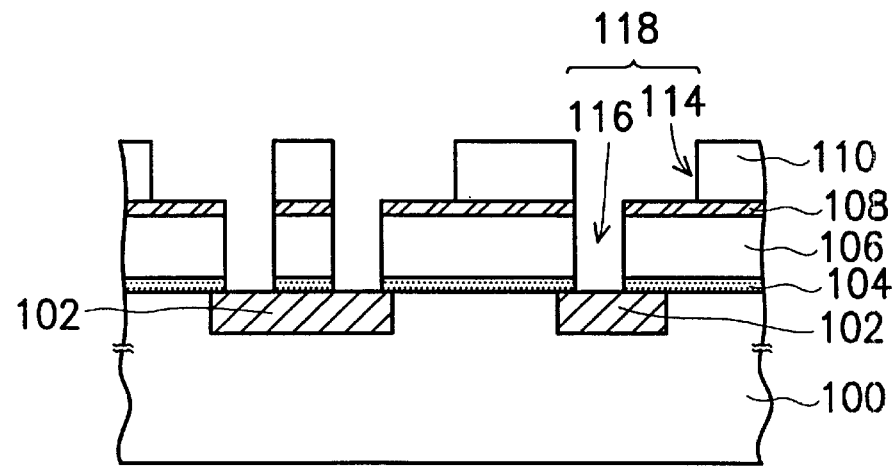
Figure 1D:
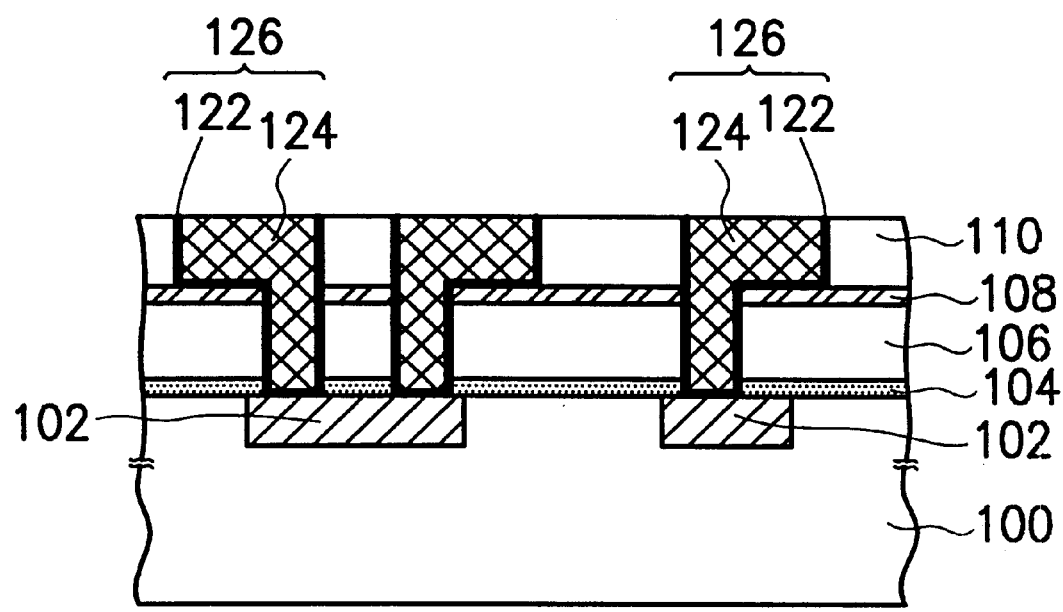
Figure 2A:
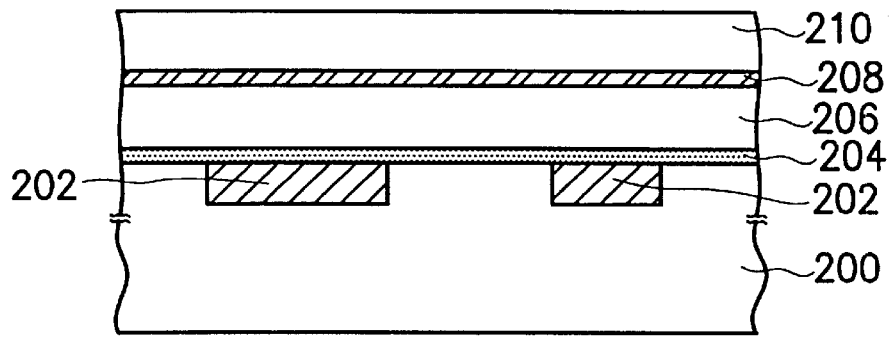
FIGS. 2A through 2E are schematic, cross-sectional views showing processing steps taken in the fabricating method of a dual damascene structure in a preferred embodiment according to the invention.

Referring to FIG. 2A, an etching stop 204 and a dielectric layer 206 are formed on a provided substrate 200, wherein the substrate 200 contains a preformed conducting layer 202. A planarization process is performed on the dielectric layer 206, so that the thickness of the remaining dielectric layer 206 is equal to the depth of a desired via plug to be formed in a follow-up process. On the top of the planarized dielectric layer 206, another etching stop 208 and dielectric layer 210 are deposited in sequence. A planarization process is also performed on the top surface of the dielectric layer 210 after the deposition process. The thickness of the dielectric layer 210 after the planarization process is equal to the thickness of a conducting wire of the desired dual damascene structure. The dielectric layers 206 and 210 include silicon oxide, fluorine-doped silicon oxide (FSG), phosphosilicate glass (PSG), low-permittivity spin on polymer (SOP), such as aromatic-ring polymer, gel, methylsiloxane compounds, or hydrogen silsesquioxane (HSQ), or other low-permittivity materials. The etching stop 204 includes silicon nitride formed by a process such as chemical vapor deposition, and the etching stop 208 includes silicon-oxy-nitride or silicon nitride formed by a process such as chemical vapor deposition.

Figure 2B:
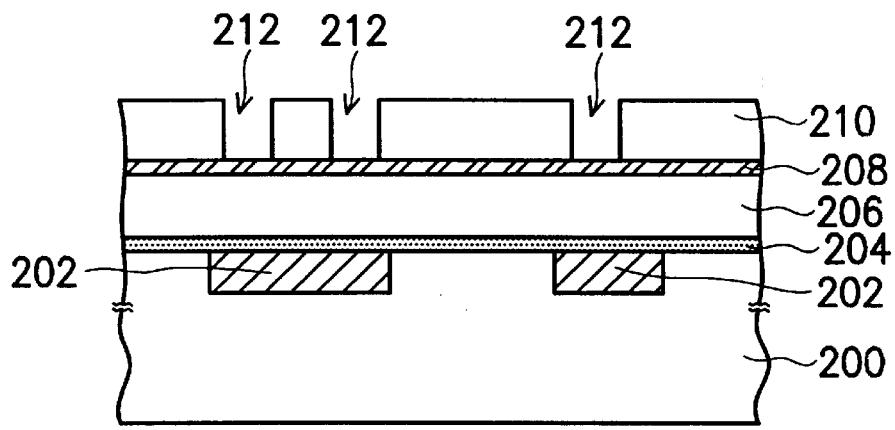

Referring next to FIG. 2B, the dielectric layer 210 is patterned to form openings 212, wherein the positions of the openings 212 correspond to the positions of the metal layer 202 underneath. The steps of forming openings 212 include depositing and patterning a photoresist layer (not shown in figure), and performing an etching process on the dielectric layer 210 by using the patterned photoresist layer as a mask and using the etching stop 208 as etching end point. The photoresist layer is removed after the formation of openings 212.

Figure 2C:
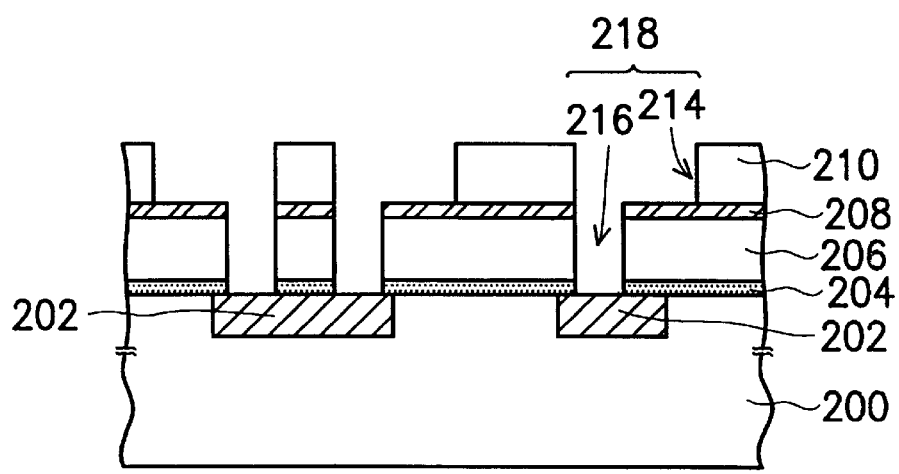

Referring to FIG. 2C, a portion of the etching stop 208 that is exposed within the openings 212 is removed for transferring pattern onto the etching stop 208. By using another patterned photoresist layer (not shown in figure) and the patterned etching stop 208 as masks, a portion of the dielectric layer 206 beneath the openings 212 and a portion of the dielectric layer 210 around the openings 212 are removed to form via holes 216 and trenches 214. Then, by using the etching stop 208 as a mask, a portion of the etching stop 204 is removed, so that the metal layer 202 is exposed by the via holes 216. The trenches 214 are further widened by the etching process as well. The trenches 214 and via holes 216 compose the openings 218 of a dual damascene structure. The etching stop 204 protects the substrate 200 and the conducting layer 202 thereon from being damaged by the etching process performed on the dielectric layer 206 in a case where misalignment occurs.

Figure 2D:
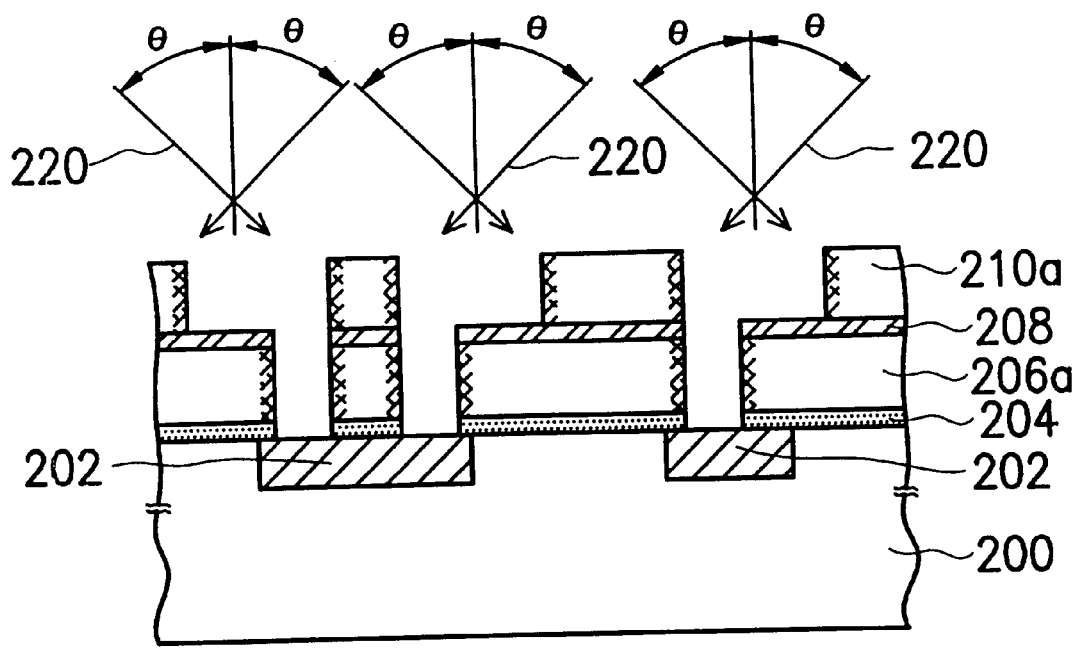

Referring next to FIG. 2D, dopants are implanted into the surface of the dielectric layers 206 and 210 neighboring and within the openings 218 by an implanter at an implanting angle θ220 away from the normal line perpendicular to the surface of the substrate. The implanting angle θ is about 0° to 10°. Preferably, the dopants, such as phosphorus boron, or arsenic, are implanted at an amount of energy of about 50 KeV to 500 KeV. In order to ensure that the dopants are evenly distributed in the exposed surface of dielectric 206 and 210, the wafer rotates at a constant angular speed during the implantation process. The densified surface 206a and 210a are able to prevent the occurrence of poisoned trenches and vias during a follow-up metallization process. In the mean time, the low-permittivity dielectric still provides a short RC delay.

Figure 2E:
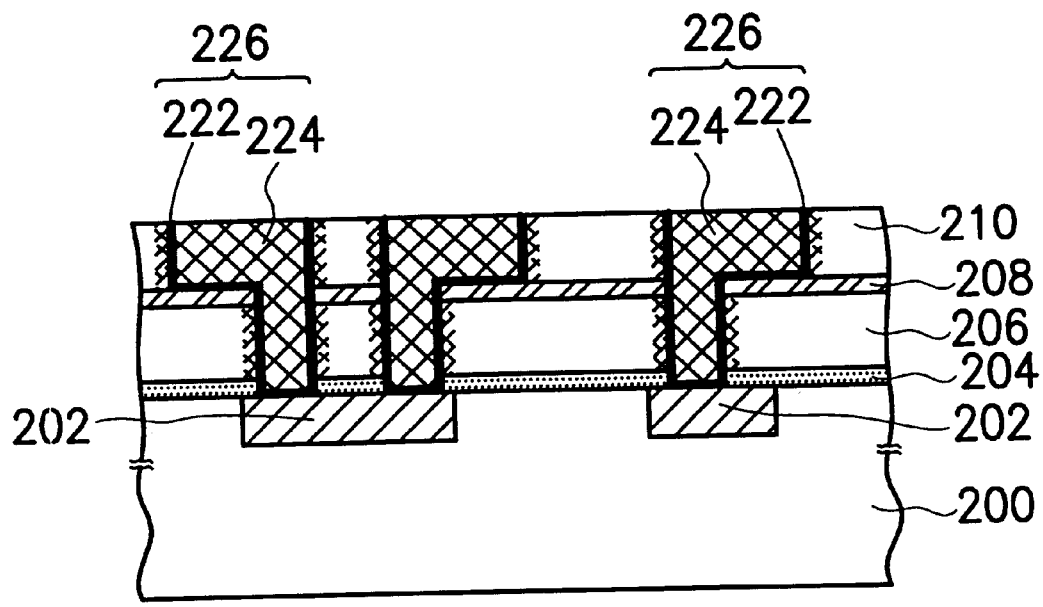

As shown in FIG. 2E, the opening 218 is filled with a conductive material, such as a barrier/glue layer 222 and a metal layer 224. The barrier/glue layer 222 conformal to the substrate 200 is formed on the top of the dielectric layer 210 and the inner surface of openings 218, wherein the barrier/glue layer 222 includes titanium/titanium nitride, tantalum, tantalum nitride, tungsten nitride, titanium nitride, boron nitride, or tantalum-silicon-nitride (TaSiN). The metal layer 224 is deposited on the barrier/glue layer 222 and fills the openings 218, wherein the metal layer 224 includes aluminum, tungsten, gold, or copper. By performing a planarization process, such as a chemical mechanical polishing process, the unwanted barrier/glue layer 222 and the metal layer 224 located on the top of the dielectric layer 210 are removed to form a dual damascene structure 226.

Since the dopants are implanted in a waferthat is rotating at a constant speed with a angle θ away from the normal line perpendicular to the surface of the substrate, the predetermined surface is evenly densified. Hence, the occurrence of poisoned trenches and vias in a dual damascene process is efficiently prevented.

Therefore, it is a specificity of the invention to suppress the parasitic capacitance of a semiconductor device for improving the performance of the device by utilizing low-permittivity dielectrics.

It is also a specificity of the invention to prevent the occurrence of poisoned trenches and vias in the low-permittivity dielectrics to improve the reliability of a semiconductor device by performing an implantation process to densify a predetermined surface of the low-permittivity dielectric.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for preventing poisoned trenches and vias, the method comprising;
   providing a substrate, wherein the substrate further comprises a conducting layer;
   forming a dielectric layer on the substrate;
   forming a trench and a via hole on the dielectric layer, wherein the trench and the via hole form a opening, and wherein the via hole exposes the conducting layer underneath;
   performing an implantation process with an amount of energy and at a angle away from a normal line perpendicular to the substrate, for implanting a dopant into a portion of the dielectric layer exposed by the opening; and
   filling the opening with a conductive material to form a dual damascene structure.

2. The method of claim 1, wherein the dielectric layer includes silicon oxide, fluorine-doped silicon oxide, or phosphosilicate glass.

3. The method of claim 1, wherein the dielectric layer includes low-permittivity materials.

4. The method of claim 1, wherein the dielectric layer includes spin on polymer.

5. The method of claim 4, wherein the dielectric layer includes aromatic-ring polymer, gel, methylsiloxane compounds, or hydrogen silsesquioxane.

6. The method of claim 1, wherein the amount of energy is about 50 KeV to 500 KeV.

7. The method of claim 1, wherein the angle is about 0° to 10°.

8. The method of claim 1, wherein the dopant includes phosphorus or arsenic, or boron.

9. The method of claim 1, wherein the conductive material comprises;
   a barrier/glue layer; and
   a metal layer.

10. The method of claim 9, wherein the barrier/glue layer includes at least one of titanium/titanium nitride, tantalum/ tantalum nitride, tungsten nitride, titanium nitride, boron nitride, and tantalum-silicon-nitride (TaSiN).

11. The method of claim 9, wherein the metal layer includes at least one of aluminum, tungsten, and copper.

12. A method for preventing poisoned trenches and vias, the method comprising;

provided a substrate, wherein the substrate further comprises a conducting layer;

forming a first etching stop, a first dielectric layer, a second etching stop, and a second dielectric layer on the substrate in sequence;

patterning the second dielectric layer to form an opening by using the second etching stop as an etching end point, wherein the opening is located at a position corresponding to the conducting layer underneath;

removing a portion of the second etching stop exposed within the opening for transferring pattern onto the second etching stop; removing a portion of the second dielectric layer and a portion of the first dielectric layer by using the first etching stop as an etching end point and using the second etching stop as a mask, for transferring the opening to the first dielectric layer to expose the first etching stop, and widening the opening to form a trench on the second dielectric layer, wherein the opening and the trench form a dual damascene opening;

removing a portion of the first etching stop exposed within the opening to expose the conducting layer;

performing an implantation process at an angle with an amount of energy on the first dielectric layer and second dielectric layer exposed within the opening; and filling the dual damascene opening with a conductive material to form a dual damascene structure.

13. The method of claim 12, wherein the first etching stop includes silicon nitride.

14. The method of claim 12, wherein the second etching stop includes silicon-oxy-nitride.

15. The method of claim 12, wherein the first dielectric layer and the second dielectric layer include silicon oxide, fluorine-doped silicon oxide, or phosphosilicate glass.

16. The method of claim 12, wherein the first dielectric layer and the second dielectric layer include low-permittivity materials.

17. The method of claim 12, wherein the first dielectric layer and the second dielectric layer include spin on polymer.

18. The method of claim 17, wherein the first dielectric layer and the second dielectric layer include aromatic-ring polymer, gel, methylsiloxane compounds, or hydrogen silsesquioxane.

19. The method of claim 12, wherein the angle is about 0° to 10°.

20. The method of claim 12, wherein the amount of energy is about 50 KeV to 500 KeV.

21. The method of claim 12, wherein the dopant includes phosphorus, boron or arsenic.

22. The method of claim 12, wherein the conductive material comprises;

a barrier/glue layer; and a metal layer.

23. The method of claim 22, wherein the barrier/glue layer includes at least one of titanium/titanium nitride, tantalum, tantalum nitride, tungsten nitride, titanium nitride, boron nitride, and tantalum-silicon-nitride (TaSiN).

24. The method of claim 22, wherein the metal layer includes at least one of aluminum, tungsten, gold, and copper.

25. The method of claim 12, wherein the step of filling the dual damascene structure further comprises a planarization process.

* * * * *